(12) United States Patent
Iijima et al.

(10) Patent No.: US 6,783,652 B2
(45) Date of Patent: Aug. 31, 2004

(54) PROCESS FOR MANUFACTURING A WIRING BOARD

(75) Inventors: Takahiro Iijima, Nagano (JP); Akio Rokugawa, Nagano (JP); Yasuyoshi Horikawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 217 days.

(21) Appl. No.: 09/997,665

(22) Filed: Nov. 26, 2001

(65) Prior Publication Data

US 2002/0066672 A1 Jun. 6, 2002

(30) Foreign Application Priority Data

Dec. 1, 2000 (JP) ........................................ 2000-366796

(51) Int. Cl.[7] .............................. C25D 5/02; C25D 5/52
(52) U.S. Cl. ...................................... 205/125; 205/222
(58) Field of Search ................................ 205/118, 125, 205/164, 166, 167, 221, 223, 222

(56) References Cited

U.S. PATENT DOCUMENTS

| | | | |
|---|---|---|---|
| 4,789,648 A | 12/1988 | Chow et al. | 437/225 |
| 5,093,279 A | 3/1992 | Andreshak et al. | 437/173 |
| 5,333,379 A * | 8/1994 | Odaira et al. | 29/841 |
| 5,635,423 A | 6/1997 | Huang et al. | 437/195 |
| 5,870,289 A * | 2/1999 | Tokuda et al. | 361/779 |
| 6,254,758 B1 * | 7/2001 | Koyama | 205/187 |
| 6,355,153 B1 * | 3/2002 | Uzoh et al. | 205/87 |

* cited by examiner

*Primary Examiner*—Edna Wong
(74) *Attorney, Agent, or Firm*—Paul & Paul

(57) ABSTRACT

A resin plate having wiring pattern recesses and via through holes is made. All of the surfaces of the resin plate including inner walls of the wiring pattern recesses and via through holes are coated with a metal film. An electro-plating is applied using the metal film as a power-supply layer to fill a plated metal into the wiring pattern recesses and via through holes. The metal film formed on the resin plate except for the inner walls of the wiring pattern recesses and via through holes is removed, so that wiring pattern and via are exposed on a surface the same as that of the resin plate.

14 Claims, 7 Drawing Sheets

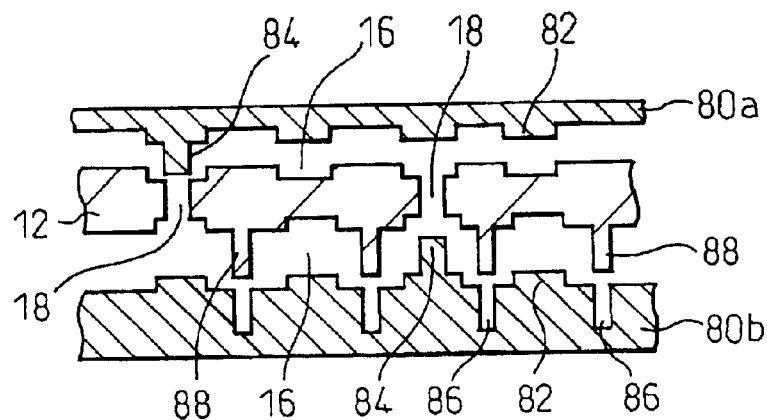
Fig.8(a)
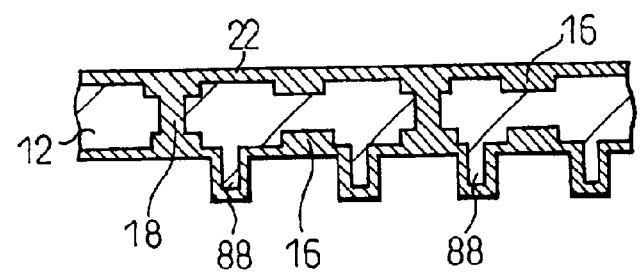
Fig.8(b)
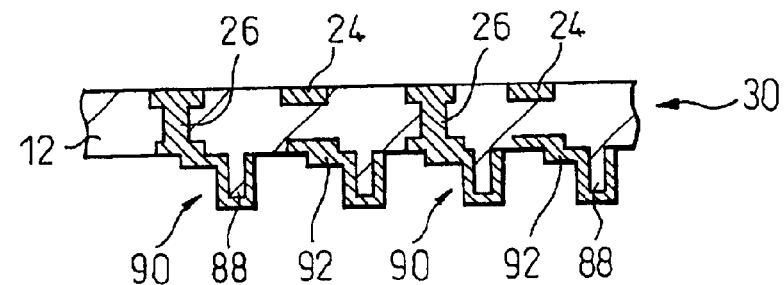
Fig.8(c)
Fig.9
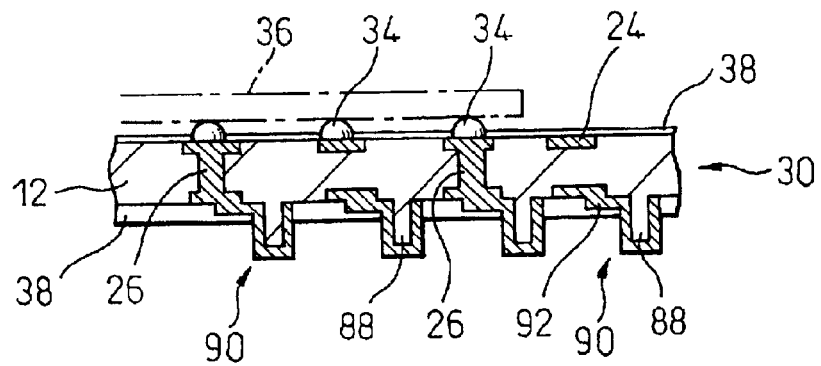

PROCESS FOR MANUFACTURING A WIRING BOARD

BACKGROUND OF THE INVENTION

1. Field of the Invention

The present invention relates to a process for manufacturing a wiring board and, more particularly, to a process for manufacturing a circuit board in which a first wiring pattern formed on a first surface of a substrate made of resin as a basic material is electrically connected to a second wiring pattern formed on a second surface opposite to the first surface by means of vias penetrating through the substrate.

2. Description of the Related Art

One of the known processes for manufacturing a wiring board on which semiconductor elements, or other electronic elements, is mounted are called a "damascene" method.

An example of such "damascene" method is shown in FIGS. 10(a) to 10(e). FIG. 10(a) is a cross-sectional view of a wiring board 100 on which wiring patterns 140a are formed. The wiring board 100 is made of resin as a basic material. The wiring pattern 140a can be formed by coating photo-resist on the respective surfaces of the resin plate on which copper foils are attached beforehand, light-exposing thereto in accordance with a predetermined pattern for forming the wiring patterns 140a, developing the same to form a resist pattern, and etching the exposed portions of the copper foil using a masking of the resist pattern to remove the exposed area.

The wiring patterns 100a formed on the respective surfaces of the wiring board 100 are electrically connected to each other by means of through holes 120. The through holes 120 are formed by forming via holes by drilling the wiring board 100, and then forming a thin metal film on the inner wall of the via holes by electroless-plating, and then forming a conductor layer on the inner wall of the via holes by electroplating using the thin metal film as a power-supply layer.

In addition, on the respective surfaces 160a and 160b of the wiring board 100 shown in FIG. 10(a) resin layers 160a and 160b are formed by coating the same with a resin, such as a polyimide or an epoxy resin, as shown in FIG. 10(b).

As shown in FIG. 10(c), via recesses 130 and wiring pattern recesses 132 are formed on the resin layers 160a and 160b by irradiating laser light, such as, $CO_2$ laser or excimer laser light.

The wiring board 100 thus having the resin layers 160a and 160b formed with the via recesses 130 and wiring pattern recesses 132 is now processed as follows. As shown in FIG. 10(d), after a metal thin film is formed on the inner wall of the via recesses 130 and wiring pattern recesses 132 and on the surface of the resin layer 160a by electroless-plating of copper or the other, an electro-plating is applied to fill the via recesses 130 and wiring pattern recesses 132 with plated metal 134 using the metal thin film as a power-supply layer. In this case, the surface of the resin layer 160a is also coated with a plated metal 134.

Therefore, the plated metal 134 covering the surface of the resin layer 160a is removed by polishing, as shown in FIG. 10(e), and thus the surface of the resin layer 160a is exposed. By such a polishing the wiring patterns 150a consisting of vias 120 formed with the filled plated metal 134 in the via recesses 130 and plated metal 134 filled in the wiring pattern 132 recesses are exposed on the same surface as the surface of the resin layer 160a, so that the wiring patterns 150a are formed on the surface of the resin layer 160a.

According to the "damascene" method as mentioned above, very fine and dense wiring patterns can be obtained as compared with a conventional wiring board which is made by a "sub-tractive" method or a "semi-additive" method as known in the prior art.

However, the wiring patterns formed on the respective surfaces of the wiring board 100 are electrically connected with each other by means of through holes 120. Since the wiring pattern and through holes 120 are formed respectively by the separate processes, it is difficult to reduce the production cost of the wiring board 100.

Also, since the via recesses 130 and wiring pattern recesses 132 of the resin layers 160a and 160 are formed by irradiating laser light, such as $CO_2$ laser or excimer laser light, a facility for irradiating laser light is necessary. Also, since the depth of the via recesses 130 is different from that of the wiring pattern recesses 132, it is necessary to precisely control the intense or irradiation time of laser beam. Thus, the production cost of the obtained wiring board is high.

SUMMARY OF THE INVENTION

An object of the present invention is to provide a process for manufacturing a wiring board capable of easily forming via recesses for filling with plating metal and of reducing the production cost of the wiring board.

According to the present invention, there is provided a process for manufacturing a wiring board, said process comprising the following steps of: making a resin plate having wiring pattern recesses and via through holes; coating all of the surfaces of the resin plate including inner walls of said wiring pattern recesses and via through holes with a metal film; applying an electro-plating using said metal film as a power-supply layer to fill a plated metal into said wiring pattern recesses and via through holes; and removing said metal film formed on said resin plate except for the inner walls of said wiring pattern recesses and via through holes, so that wiring pattern and vias are exposed on a surface the same as that of said resin plate.

The resin plate is formed by a press-forming process. Otherwise, the resin plate can be formed by an injection molding process.

The above mentioned process further comprises the following steps of: forming pads on one of surfaces of the wiring board to which external connecting terminals are to be attached.

The above mentioned process further comprises the following steps of: using said wiring board as a core substrate; and forming wiring patterns on the respective surface of the core substrate by means of resin layers to obtain a multi-layer wiring board.

According to another aspect of the present invention, there is provided a process for manufacturing a multi-layer wiring board, said process comprising:

(a) manufacturing a core substrate comprising the steps of: making a resin plate having wiring pattern recesses and via through holes; coating all of the surfaces of the resin plate including inner walls of said wiring pattern recesses and via through holes with a metal film; applying an electro-plating using said metal film as a power supply layer to fill a plated metal into said wiring pattern recesses and via through holes; and removing said metal film formed on said resin plate except for the inner walls of said wiring pattern recesses and via through holes, so that wiring pattern and vias are exposed on a surface same as that of said resin plate; and (b) forming resin layers on respective surfaces of said core substrate so that said resin layers includes wiring pattern recesses and via through holes;

(c) coating all of surfaces of said resin layers including inner walls of said wiring pattern recesses and via through holes with a metal film;

(d) applying an electro-plating using said metal film as a power supply layer to fill a plated metal into said wiring pattern recesses and via through holes; and (e) removing said metal film attached to said resin layer except for the inner walls of said wiring pattern recesses and via through holes, so that wiring pattern and vias are exposed on a surface same as that of said resin plate.

BRIEF DESCRIPTION OF THE DRAWINGS

FIGS. 8(a) to 8(c) are views explaining still another embodiment of a process for manufacturing a wiring board of this invention;

FIG. 9 is a partial cross-sectional view of an embodiment of a semiconductor package obtained by a process as shown in FIGS. 8(a) and 8(b)

DETAILED DESCRIPTION OF THE PREFERRED EMBODIMENTS

Figure 1A:
FIGS. 1(a) to 1(e) are cross-sectional views explaining an embodiment of a process for manufacturing a wiring board process according to this invention.
Figure 1B:
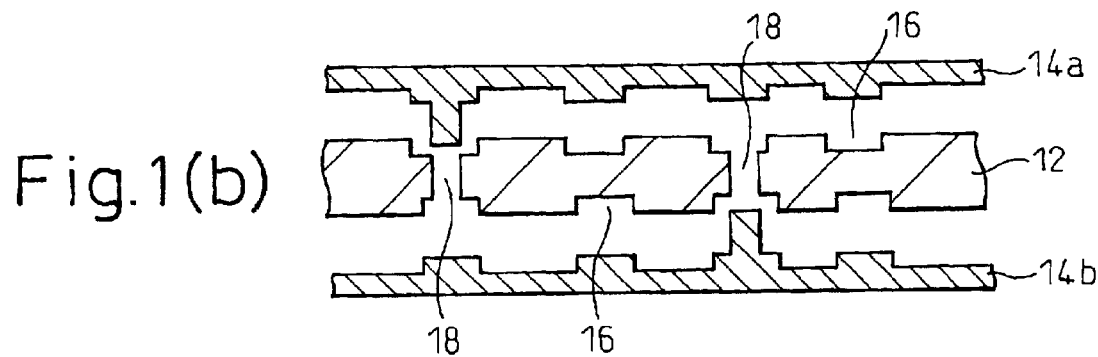
Figure 1C:
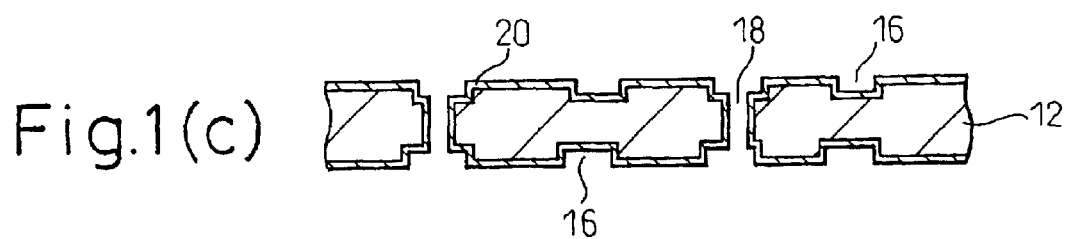

FIGS. 1(a) to 1(e) explain an embodiment of a process for manufacturing a wiring board process according to this invention, in which the wiring board is produced by a press-forming a processing resin plate. First, the processing resin plate 10 as shown in FIG. 1(a) is subjected to press forming by a pair of molds 14a and 14b as shown in FIG. 1(b) so that a resin plate 12 is obtained. The resin plate 12 is formed with the wiring pattern recesses 16, and the via through holes 18 the pair of molds 14a and 14b.

Either of a thermoplastic resin or a thermosetting resin can be used as the processing resin plate 10. In case of using a thermoplastic resin, it is preferable that the processing resin plate 10 is softened by heating so that a press forming can be smoothly carried out. In case of using a thermosetting resin, it is preferable to use such a processing resin plate which is softened so as to smoothly carrying out the press forming process.

A thin metal film 20 is formed all over the surface including the inner walls of the via through holes 18, and the wiring pattern recesses 16. Although the metal film 20 can be formed by vapor deposition or sputtering, it is preferable to form such a thin metal film 20, made of such as a copper, by electroless-plating.

Figure 1D:
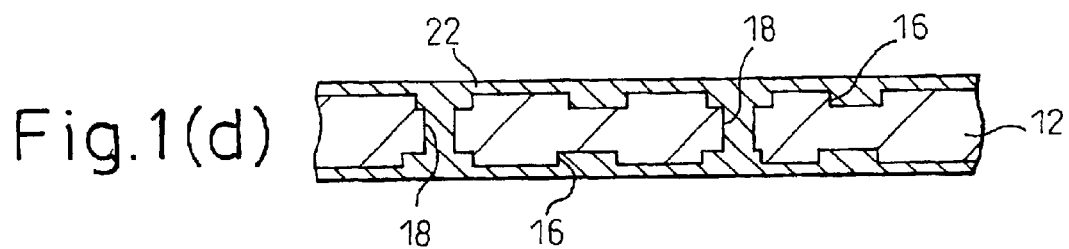

Next, as shown in FIG. 1(d), an electro-plating is applied to the resin plate 12 covered with the thin metal plate 20 using the thin metal plate 20 as a power supply layer, so that the via through holes 18, and the wiring pattern recesses 16 are filled with the plated metal to form a metal layer 22. The metal layer 22 is also formed on the surface of the resin plate 10 where the via through holes 18 and the wiring pattern recesses 16 are not formed. The metal layer 22 serves to electrically connect the vias and the wiring patterns which are formed by filling the via through holes 18 and the wiring pattern recesses 16 with the plated metal.

Figure 1E:
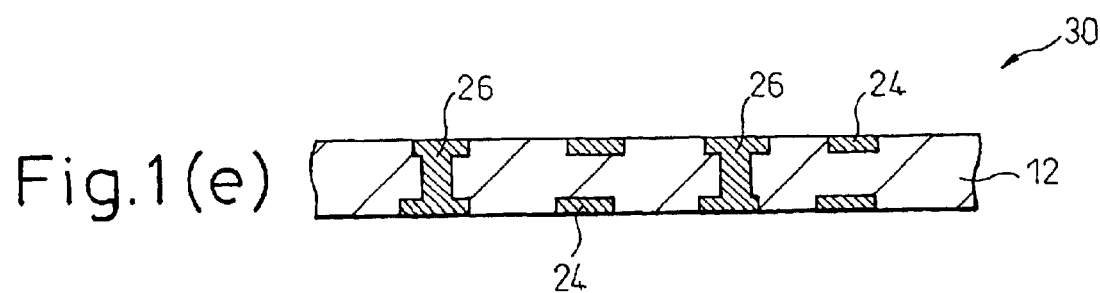

Therefore, the metal layer 22 formed on the resin plate 12, except for the portions of the metal layer 22 formed on the inner walls of the via through holes 18 and the wiring pattern recesses 16, is partially polished to obtain a wiring board 30 in which the surfaces of the vias 18 and the wiring patterns 24 are exposed at the same level as the surface of the resin plate 12, as shown in FIG. 1(e).

Figure 2:
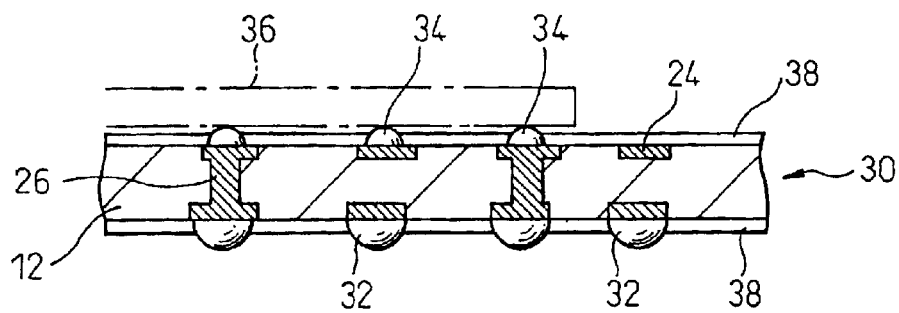
FIG. 2 is a partial cross-sectional view of an embodiment of a semiconductor package obtained by a process as shown in FIGS. 1(a) to 1(e)

As shown in FIG. 1(e), the wiring board 30 is formed by polishing the respective surfaces of the resin plate 12 and thus a semiconductor package, as shown in FIG. 2, on which a semiconductor element 36 can be mounted, can thus be obtained. The semiconductor package shown in FIG. 2 is provided on one of the surfaces of the resin plate 12 with solder balls 34 as connecting terminals which can be connected to electrode terminals of the semiconductor element 36 to be mounted, and on the pads formed on the other surface of the resin plate 12 with solder balls 32 as external connecting terminals.

The respective surfaces of the resin plate 12 are coated with solder resists 38 except for the solder balls attached to the respective pads.

The wiring board 30 shown in FIG. 1(e) can be used as a core substrate and therefore multi-layer wiring patterns are formed on the respective surfaces of the core substrate to obtain a multi-layer wiring board.

The wiring board 30 in this embodiment can be made by filling the plated metal into via through holes 18 and wiring pattern recesses 16, made by press forming the resin plate 12, to form the vias 26 and wiring patterns 24. Therefore, the via through holes 18 and wiring pattern recesses 16 can be made simultaneously as compared with drilling and thus a multi-layer wiring board, in which a plurality of the vias 26 are very densely arranged, can be obtained with low cost.

A conventionally known build-up method shown in FIG. 3(a) to 3(d) can also be used to make a multi-layer wiring board using the wiring board 30 as a core substrate. FIG. 3(a) to 3(d) explain a process for forming wiring patterns on one of the surfaces of the wiring board 30. However, it is also possible to simultaneously form such wiring patterns on the other surface of the wiring board 30, although an explanation is omitted.

Figure 3A:
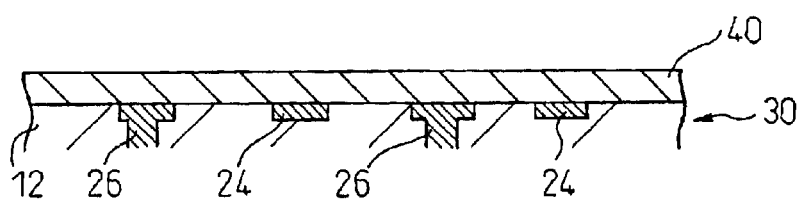
FIGS. 3(a) to 3(d) are views explaining an embodiment of a process for manufacturing a multi-layer wiring board using a wiring board obtained by the process shown in FIGS. 1(a) to 1(e)
Figure 3B:
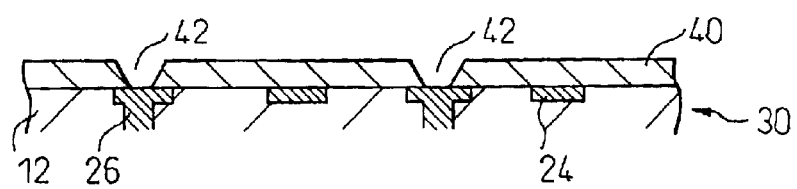

In this build-up method, after resin layers 40 are formed on the respective surfaces of the wiring board 30 as a core substrate as shown in FIG. 3(a), via recesses 42 are formed by irradiating laser light, such as $CO_2$ laser or excimer laser light, to the positions of the resin plate 40 to form via recesses 42, as shown in FIG. 3(b). Pad surfaces are exposed on the bottom of the via recesses 42.

Figure 3C:
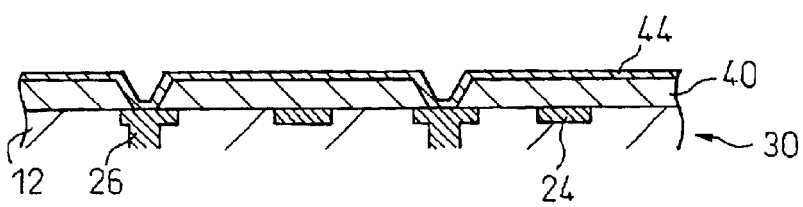

Next, as shown in FIG. 3(c), a metal layer 44 having a certain thickness is formed by electro-plating over all of the surfaces of the resin plate 40 including the inner walls of the via recesses 42 using a thin metal film formed by electroless-plating as a power-supply electrode. It is preferable that this metal layer 44 is made of copper.

Figure 3D:
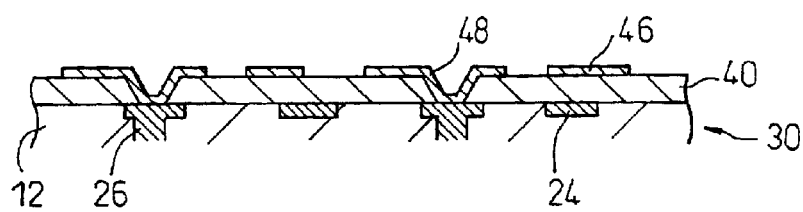

Then, the metal layer 44 is patterned to form wiring patterns 46 and vias 48, as shown in FIG. 3(d).

Figure 4:
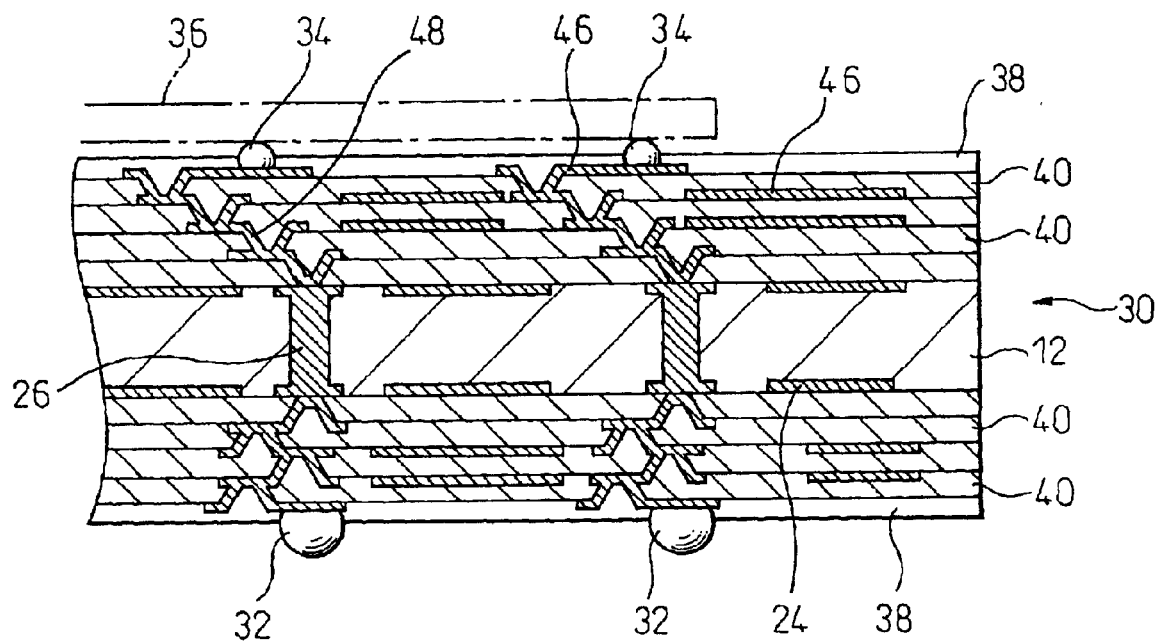
FIG. 4 is a partial view of an embodiment of a multi-layer wiring board obtained by a process as shown in FIGS. 3(a) to 3(d)

Next, a resin layer 40 is also formed on the resin layer 40 provided with the wiring patterns 46 and vias 48, and the steps of FIGS. 3(b) to 3(d) are repeated to obtain a multi-layer wiring board as shown in FIG. 4. The multi-layer wiring board 40 shown in FIG. 4 is also a semiconductor package, on which a semiconductor element 36 can be mounted, wherein the semiconductor package is provided on one of the surfaces of the resin plate 12 with solder balls 34 as connecting terminals which can be connected to electrode terminals of the semiconductor element 36 to be mounted, and on the pads formed on the other surface of the resin plate 12 with solder balls 32 as external connecting terminals.

The respective surfaces of the multi-layer wiring board are coated with solder resists 38 except for the solder balls 32 attached to the respective pads.

In the multi-layer wiring board 30 shown in FIG. 4, as the resin layer 40 is again formed on the resin layer 40 formed with the wiring patterns 46 and vias 48 to form wiring patterns 46 and the vias 48, the upper layer of the resin layer 40 for forming the multi-layer wiring board can be easily an uneven surface.

In this connection, as shown in FIGS. 5(a) to 5(e), a multi-layer wiring board 40 is formed by press-forming, the surface of the upper, resin layer 40 of the multi layer wiring board can be made flat. FIGS. 5(a) to 5(e) also explain a process for forming wiring patters on one of the surfaces of the wiring board 30. However, it is also possible to simultaneously form such wiring patters on the other surface of the wiring board 30, although an explanation is omitted.

Figure 5A:
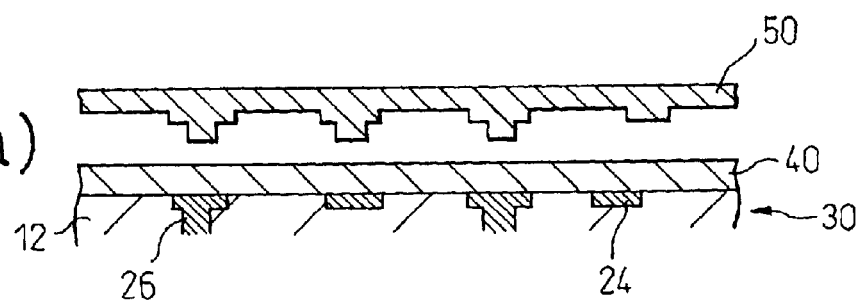
FIGS. 5(a) to 5(e) are views explaining another embodiment of a process for manufacturing a multi-layer wiring board using a wiring board obtained by the process shown in FIGS. 1(a) to 1(e)
Figure 5B:
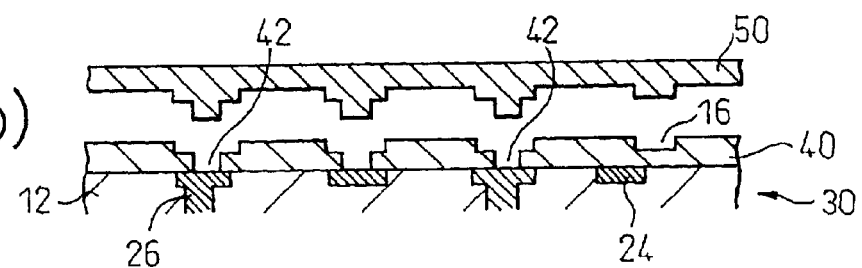

In this embodiment, after resin layers 40 are formed on the respective surfaces of the wiring board 30 as shown in FIG. 5(a), via recesses 42 and wiring pattern recesses 16 are formed by press-forming using a pair of pressing molds 50 (in FIGS. 5(a) and 5(b), one of the pressing molds 50 is only shown). There is a possibility that a resin film remain on the bottom of the via recesses 42. Therefore, the resin film remained on the bottom of the via recesses 42 is removed by etching so that the pads are completely exposed on the bottom of the via recesses 42.

Figure 5C:
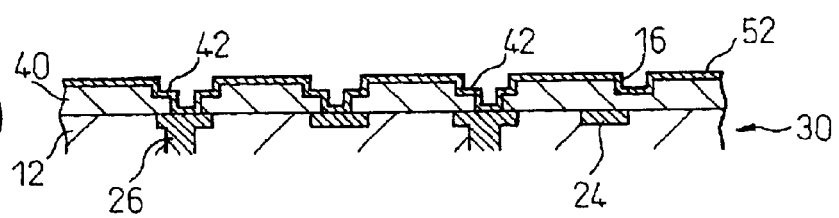

Next, as shown in FIG. 5(c), a thin metal film 52 is formed over the all surfaces of the resin layer 40 including the inner walls of the via recesses 42 and wiring pattern recesses 16 by such as electroless-plating.

Figure 5D:
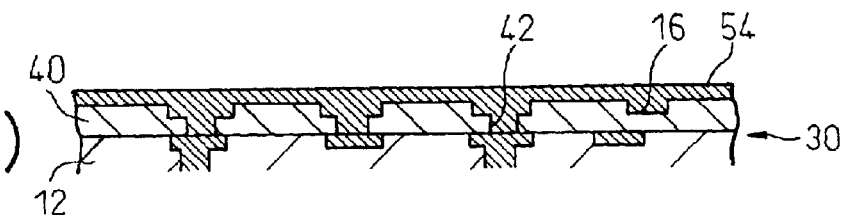

In addition, an electro-plating is carried out using the metal film 52 as a power-supply layer, as shown in FIG. 5(d), to fill the plated metal into the via recesses 42 and wiring pattern recesses 16 to form a metal layer 54 having a certain thickness. It is preferable that this metal layer 54 is made of copper.

The metal film 52 is also formed on the surface of the resin layer 40 where the via recesses 42 or wiring pattern recesses 16 are not formed. The surfaces of the metal layer 54 corresponding to the via recesses 42 or wiring pattern recesses 16 may be uneven, so that vias and wiring patterns which have been formed by filling plated metal into via recesses 42 or wiring pattern recesses 16 electrically short-circuit to each other.

Therefore, the metal layer 52 attached to the resin layer 40 is polished except for the inner walls of the via recesses 42, and the wiring pattern recesses 16, so that the surfaces of the vias 56 and the wiring patterns 24 are exposed at the same level as the surface of the resin layer 40.

Although, in the wiring board 30 of the previous embodiments shown in FIGS. 1(a) to 5(e), the resin plate 12 in which the wiring pattern recesses 16 and via though holes 18 are formed by press-forming is used, such a resin plate 12 can also be made by injection molding.

Figure 6A:
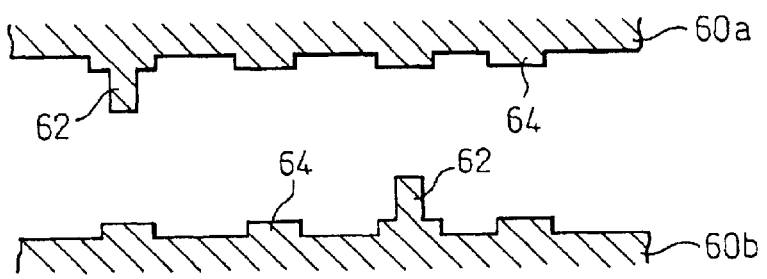
FIGS. 6(a) and 6(b) are views explaining another embodiment of a process for manufacturing a wiring board of this invention.
Figure 6B:
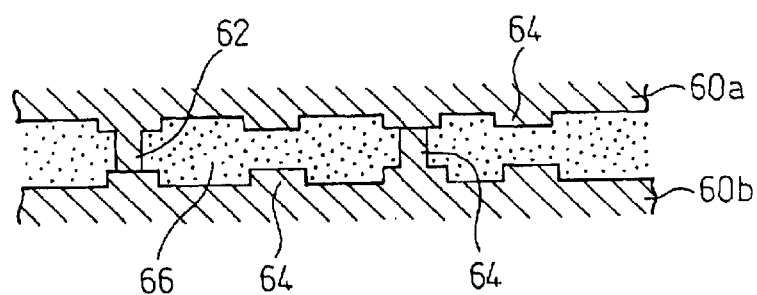

FIGS. 6(a) and 6(b) show a method of making a resin plate 12 by injection molding. In this injection molding, a pair of molds 60a and 60b having projections for forming wiring pattern recesses 16 and projections 62 for forming via through holes 18 is used. The pair of molds 60a and 60b can be made by a known electric-forging method.

Next, as shown in FIG. 6(b), after the pair of molds 60a and 60b are closed, a resin 66 is injected into the cavity defined in the pair of molds 60a and 60b. The resin may either be thermoplastic resin or thermosetting resin which have fluidity to easily flow through the narrow gaps defined by the projections 62 and 64 in the cavity.

However, if the resin 66 is a thermosetting resin, it is necessary to harden the resin after it is filled in the cavity by heating the same. Also, if the resin 66 is a thermoplastic resin, it is necessary to solidify the resin after it is filled in the cavity by cooling the same.

After the resin 66 in the cavity is hardened or solidified, the pair of molds 60a and 60b are opened and thus a resin plate as shown in FIG. 1(b) can be obtained.

Thereafter, a wiring board 30 can be obtained using a resin plate 12 by the steps as shown in FIGS. 1(a) to 1(e).

Figure 7A:
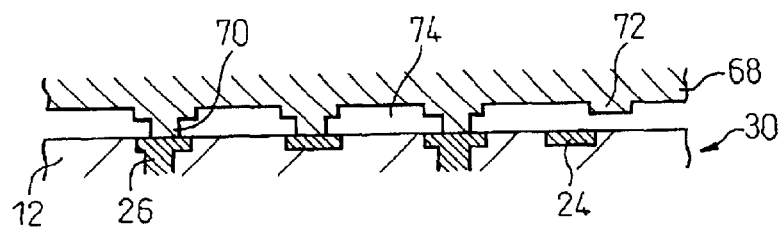
FIGS. 7(a) and 7(b) are views explaining still another embodiment of a process for manufacturing a multi-layer wiring board using a wiring board obtained by the process shown in FIGS. 1(a) to 1(e)
Figure 7B:
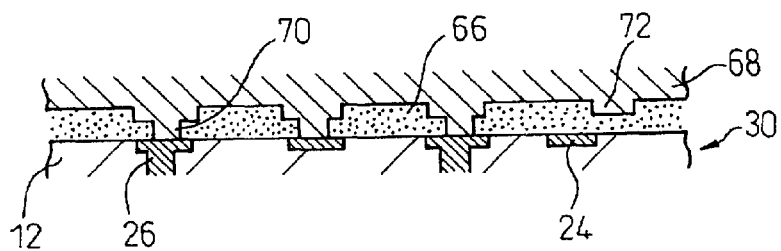
Figure 10A:
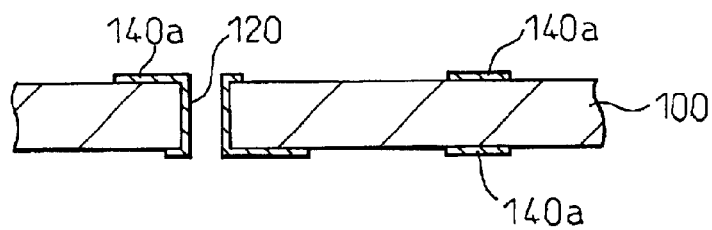
FIGS. 10(a) to 10(e) are views explaining a process for manufacturing a wiring board process conventionally known in the prior art.
Figure 10B:
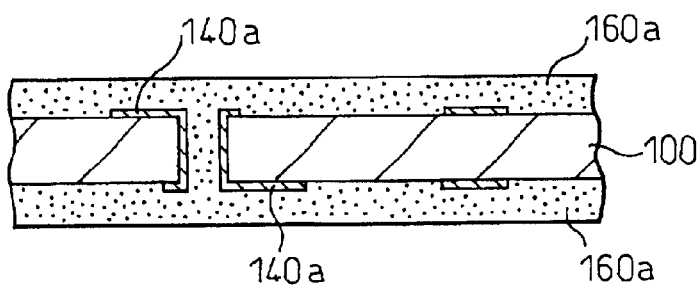
Figure 10C:
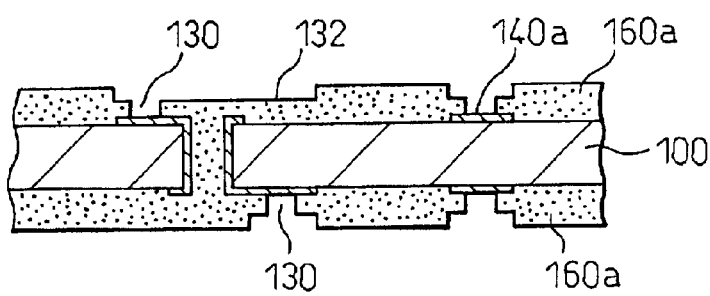
Figure 10D:
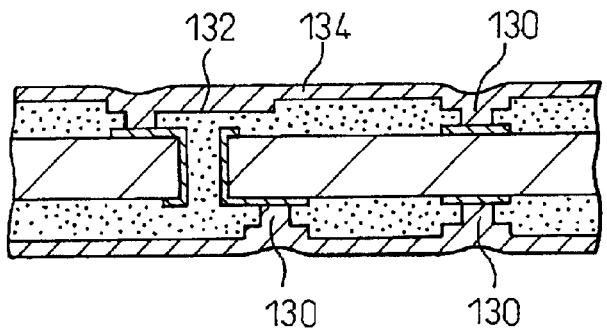
Figure 10E:
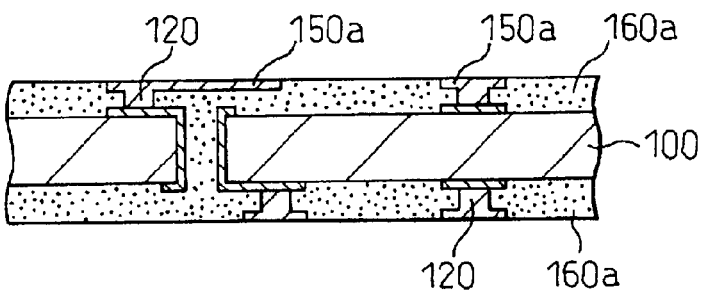

As shown in FIGS. 7(a) and 7(b), a multi-layer wiring board can be obtained by using such an injection molding. FIGS. 7(a) and 7(b) explain a process for forming wiring patterns on one of the surfaces of the wiring board 30. However, it is also possible to simultaneously form such wiring patterns on the other surface of the wiring board 30, although an explanation is omitted.

First, as shown in FIG. 7(a), a pair of molds 68, 68 (in FIGS. 7(a) and 7(b) only one of the pair of molds 68, 68 is shown) having projections 72 for forming wiring pattern recesses 16 and projections 70 for forming via recesses 42 is used. This pair of molds 60a and 60b can be made by a known electric-forging method.

Next, the pair of molds 68, 68 are closed to define a cavity 74 into which a wiring board 30 is inserted, so that the tip ends of the projections 72 for forming wiring pattern recesses 16 are come into contact with the pads of the wiring board 30.

Next, a resin 66 is injected into the cavity and solidified so as to form via recesses 42 (not shown) and wiring pattern recesses 16 (not shown) on the resin layers 40 (not shown) provided on the respective surfaces of the wiring board 30.

Figure 5E:
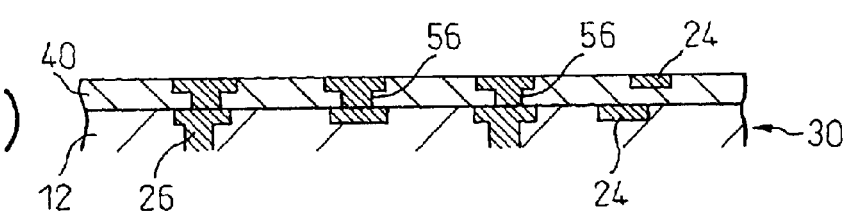

In addition, by the same steps as FIGS. 5(c) to 5(e), vias 56 and wiring patterns 16 can be formed.

Next, the wiring board 30 having the resin layer 40 provided with the vias 56 and wiring patterns 24 is inserted into the cavity 74 of the pair of injection molds 68, 68. The steps of injecting a resin 66 into the cavity 74 and hardening or solidifying the resin, and the steps of FIGS. 5(a) to 5(e) are repeated to form a multi-layer wiring board.

The wiring board 30 shown in FIG. 2 has solder balls 32 as external connecting terminals on the other surface thereof. Therefore, during the manufacturing process of the wiring board 30 a step for attaching the solder balls 32 is necessary.

In this connection, since the wiring board 30 manufactured by the process of FIGS. 8(a) to 8(c) is provided beforehand with projected portions for the external connecting terminals, so that a step for attaching solder balls 32 is no longer necessary.

First, as shown in FIG. 8(a), each of the pair of injection molds 80a and 80b is provided with projections 82 for forming wiring pattern recesses 16 and projections 84 for forming via through holes 18. In addition, the injection mold 80b is provided with recesses 86 for forming projections for the external connecting terminals.

A processing resin plate 10 as shown in FIG. 1(a) is inserted into the space between these pair of injection molds 80a and 80b, which is then closed to form a resin plate 12 which is provided with the wiring pattern recesses 16 and the via through holes 18, and also provided with projections 88 for the external connecting terminals at the positions where the external connecting terminals should be formed.

In addition, electro-plating is applied to all of the surfaces of the resin plate 12 including the inner walls of the wiring pattern recesses 16 and the via through holes 18 and outer wall of the projections 88 for the external connecting terminals using the thin metal film as a power supply layer. Thus, as shown in FIG. 8(b), the inner walls of the wiring pattern recesses 16 and the via through holes 18 are filled with a plated metal to form a metal layer 22. This metal layer is also formed on the surfaces of the resin plate 12 where the wiring pattern recesses 16 and the via through holes 18 are not formed.

Therefore, as shown in FIG. 8(c), the portions of the metal layer 22 attached to outer wall of the projections 88 for the external connecting terminals are removed and electrically disconnected from the vias 26 which are formed by filling the plated metal into the via through holes 18. Thus, a wiring board 30 is formed which has one surface on which vias 26 and the wiring patterns 24 are exposed, opposite to the other surface provided with projections 88 for external connecting terminals. Such a removal of the metal layer 22 can be carried out by polishing the metal layer on one of the surface of the resin plate 12. It is preferable to remove by etching the metal layer on the opposite surface of the resin plate 12 after forming resist patterns, exposure thereof and development thereof.

The wiring board 30 as shown in FIG. 8(c) has the other surface provided with the external connecting terminals 90 covered with metal layers 22 on the outer wall of the projections 88. The external connecting terminals 90 are electrically connected with the vies 26 by means of the wiring patterns 92.

Therefore, when the wiring board 30 shown in FIG. 8(c) is used as a semiconductor package, solder balls 34 as connecting terminals are attached to the pads of the wiring patterns 24 formed on the one surface of the resin plate which are connected to the electrode terminals of the semiconductor element 36 which is to be mounted.

Solder resist 38 is attached to the respective surfaces of the resin plate 12 except for the portions corresponding to the solder balls 34 attached to the respective pads and the external connecting terminals.

Although the pair of molds 80a and 80b are used to obtain a resin plate 12 having a predetermined shape in the embodiment shown in FIGS. 8(a) to 8(c), the pair of molds 80a and 80b can be replaced with a pair of injection molds 80a and 80b between which a cavity is defined. When these injection molds 80a and 80b are closed, a molten resin is injected into the cavity to obtain a resin plate as shown in FIG. 8(b).

In the same steps as shown in FIG. 8(b), the inner walls of the wiring pattern recesses 16 and the via through holes 18 are filled with a plated metal to form a metal layer 22.

Then, in the same steps as shown in FIG. 8(c), the portions of the metal layer 22 attached to outer wall of the projections 88 for the external connecting terminals are removed and electrically disconnected from the vias 26 which are formed by filling the plated metal into the via through holes 18. Thus, a wiring board 30 which has one surface on which vias 26 and the wiring patterns 24 are exposed, opposite to the other surface provided with projections 88 for external connecting terminals can thus be obtained.

It should be understood by those skilled in the art that the foregoing description relates to only some preferred embodiments of the disclosed invention, and that various changes and modifications may be made to the invention without departing the sprit and scope thereof.

What is claimed is:

1. A process for manufacturing a wiring board, said process comprising the steps of:

making a resin plate which has wiring pattern recesses with inner walls therein and via through holes using a pair of molds;

coating all of the surfaces of the resin plate including said inner walls of said wiring pattern recesses and said via through holes with a metal film;

electro-plating using said metal film as a power-supply layer over an entire surface of said metal film so as to fill a plated metal into said wiring pattern recesses and into said via through holes; and polishing said electro-plated metal formed on said resin plate to remove the same except for said inner walls of said wiring pattern recesses and said via through holes, to yield a wiring pattern and vias which are exposed on a surface that is the same as that of said resin plate.

2. A process as set forth in claim 1, wherein said resin plate is made by a press-forming process using a pair of press-forming molds.

3. A process as set forth in claim 1, wherein said resin plate is made by an injection molding process using a pair of injection molds.

4. A process as set forth in claim 1 further comprising the following step of:

forming pads as a part of said wiring pattern to which external connecting terminals are to be attached.

5. A process as set forth in claim 1 further comprising the steps of:

using said wiring board as a core substrate;

forming a resin layer on said core substrate; and forming a wiring pattern on said resin layer in such a manner that said wiring pattern is connected to said wiring pattern or to said vias of said core substrate.

6. A process for manufacturing a multi-layer wiring board, said process comprising:

(a) manufacturing a core substrate comprising the steps of:

making a resin plate having wiring pattern recesses with inner walls therein and having via through holes using a pair of molds;

coating all of the surfaces of the resin plate including said inner walls of said wiring pattern recesses and said via through holes with a metal film;

electro-plating using said metal film as a power-supply layer over an entire surface of said metal film to fill a plated metal into said wiring pattern recesses and into said via through holes; and polishing said plated metal formed on said resin plate to remove the same except for the inner walls of said wiring pattern recesses and of said via through holes to yield a wiring pattern and vias which are exposed on a surface that is the same as that of said resin plate; and (b) forming resin layers on respective surfaces of said core substrate so that said respective resin layers include wiring pattern recesses having inner walls thereof and include via through holes;

(c) coating all of the surfaces of said respective resin layers including said inner walls of said wiring pattern recesses and said via through holes with a metal film;

(d) electro-plating using said metal film as a power-supply layer over an entire surface of said metal film to fill a plated metal into said wiring pattern recesses and into said via through holes; and (e) polishing said plated metal formed on each of said respective resin layers to remove the same except for the inner walls of said wiring pattern recesses and said via through holes to yield a wiring pattern and vias which are exposed at a surface which is the same as that of the respective resin layer.

7. A process as set forth in claim 6, wherein said resin plate is made by a press-forming process using a press-forming mold.

8. A process as set forth in claim 6, wherein said resin plate is made by a injection molding process using an injection mold.

9. A process for manufacturing a wiring board comprising the steps of:

(a) preparing a laminated body comprising at least one resin layer and at least one wiring pattern on said resin layer;

(b) forming said resin layer with wiring pattern recesses having inner walls and with via through holes using a mold;

(c) coating all of the surfaces of the resin layer including said inner walls of said wiring pattern recesses and said via through holes with a metal film;

(d) electro-plating using said metal film as a power supply layer over an entire surface of said metal film so as to fill a plated metal into said wiring pattern recesses and said via through holes; and (e) polishing said plated metal formed on said resin layer to remove the same except for the inner walls of said wiring pattern recesses and said via through holes to yield a wiring pattern and vias, so that wiring pattern and said vias are exposed on a surface which is the same as the surface that of said resin layer.

10. A process as set forth in claim 9, wherein said resin layer is formed by press-forming process using a press-forming mold.

11. A process as set forth in claim 9, wherein said resin layer is formed injection molding process using an injection mold.

12. A process for manufacturing a multi-layer wiring board comprising the seps of:

(a) preparing a wiring board which is made in accordance with the steps as defined in claim 9;

(b) forming a second resin layer with wiring pattern recesses and with via through holes using a mold on said wiring board, said wiring pattern recesses having inner walls;

(c) coating all of the surfaces of the second resin layer including said inner walls of said wiring pattern recesses and said via through holes with a metal film;

(d) electro-plating using said metal film as a power supply layer over an entire surface of said metal film so as to fill a plated metal into said wiring pattern recesses and said via through holes; and (e) polishing said plated metal formed on said second resin layer to remove the same except for the inner walls of said wiring pattern recesses and said via through holes to yield a wiring pattern and vias, so that said wiring pattern and said vies are exposed on a surface that is the same as that of said second resin layer.

13. A process as set forth in claim 12 further comprising the following steps of:

repeating said steps (b) to (e) to obtain a multi-layer wiring board comprising a an even further or subsequent resin layer(s) formed on the resin lever.

14. A process for manufacturing a wiring board, said process comprising the steps of:

molding a resin plate to form wiring pattern recesses and via through holes in said resin plate, said wiring pattern recesses having inner walls;

coating all of the surfaces of the resin plate including said inner walls of said wiring pattern recesses and said via through holes with a metal film;

electro-plating using said metal film as a power supply layer over an entire surface of said metal film so as to fill a plated metal into said wiring pattern recesses and said via through holes; and polishing said plated metal formed on said resin plate to remove the same except for the inner walls of said wiring pattern recesses and said via through holes, to yield a wiring pattern and vias which are exposed on a surface that is the same as that of said resin plate.

* * * * *